United States Patent [19]

Brummett et al.

[11] 4,368,281

[45] Jan. 11, 1983

[54] PRINTED CIRCUITS

[75] Inventors: Charles R. Brummett, Harrisburg; J. A. Crumley, Enola; Ray N. Shaak, Lebanon, all of Pa.; Dewey R. Whitaker, Winston-Salem, N.C.

[73] Assignee: AMP Incorporated, Harrisburg, Pa.

[21] Appl. No.: 187,102

[22] Filed: Sep. 15, 1980

[51] Int. Cl.$^3$ ........................ C08K 5/56; C09D 11/10; B41M 1/00

[52] U.S. Cl. .................................... 523/458; 252/518; 427/98; 523/459; 523/462; 524/175; 524/176; 524/413; 524/431; 524/462; 524/465; 524/469; 524/473; 106/20; 174/68.5

[58] Field of Search ...................... 260/33.8 R; 427/98; 524/462, 465, 469, 473, 413, 431, 175, 176; 523/458, 459, 462; 106/20

[56] References Cited

U.S. PATENT DOCUMENTS

| | | | |
|---|---|---|---|
| 3,146,125 | 8/1964 | Schneble | 427/98 |
| 3,267,007 | 8/1966 | Sloan | 427/98 |
| 3,562,038 | 2/1971 | Shipley et al. | 427/98 |
| 3,620,933 | 11/1971 | Grunwald et al. | 427/98 |
| 3,625,758 | 12/1971 | Stahl et al. | 427/98 |
| 3,937,857 | 2/1976 | Brummett et al. | 427/98 |
| 3,954,570 | 5/1976 | Shirk et al. | 427/98 |
| 4,006,047 | 2/1977 | Brummett et al. | 427/98 |
| 4,096,043 | 6/1978 | De Angelo | 427/98 |
| 4,100,037 | 7/1978 | Baron et al. | 427/98 |
| 4,144,118 | 3/1979 | Stahl | 427/98 |

OTHER PUBLICATIONS

Derwent Abst. 60539 X/32, "Chemical Plating of Printed Circuit Plates–Palladium Catalyst Prevented . . . Ink", Hitachi (6–23–76).

*Primary Examiner*—Wilbert J. Briggs, Sr.
*Assistant Examiner*—Herbert J. Lilling
*Attorney, Agent, or Firm*—Frederick W. Raring

[57] ABSTRACT

Ink compositions especially suitable for printing electronic circuit patterns on a substrate such as a flexible polyester substrate; methods for developing electrolessly and electrolytically the circuit configurations as articles of manufacture; flexographic printing with the ink composition has been disclosed as the preferred method.

12 Claims, 3 Drawing Figures

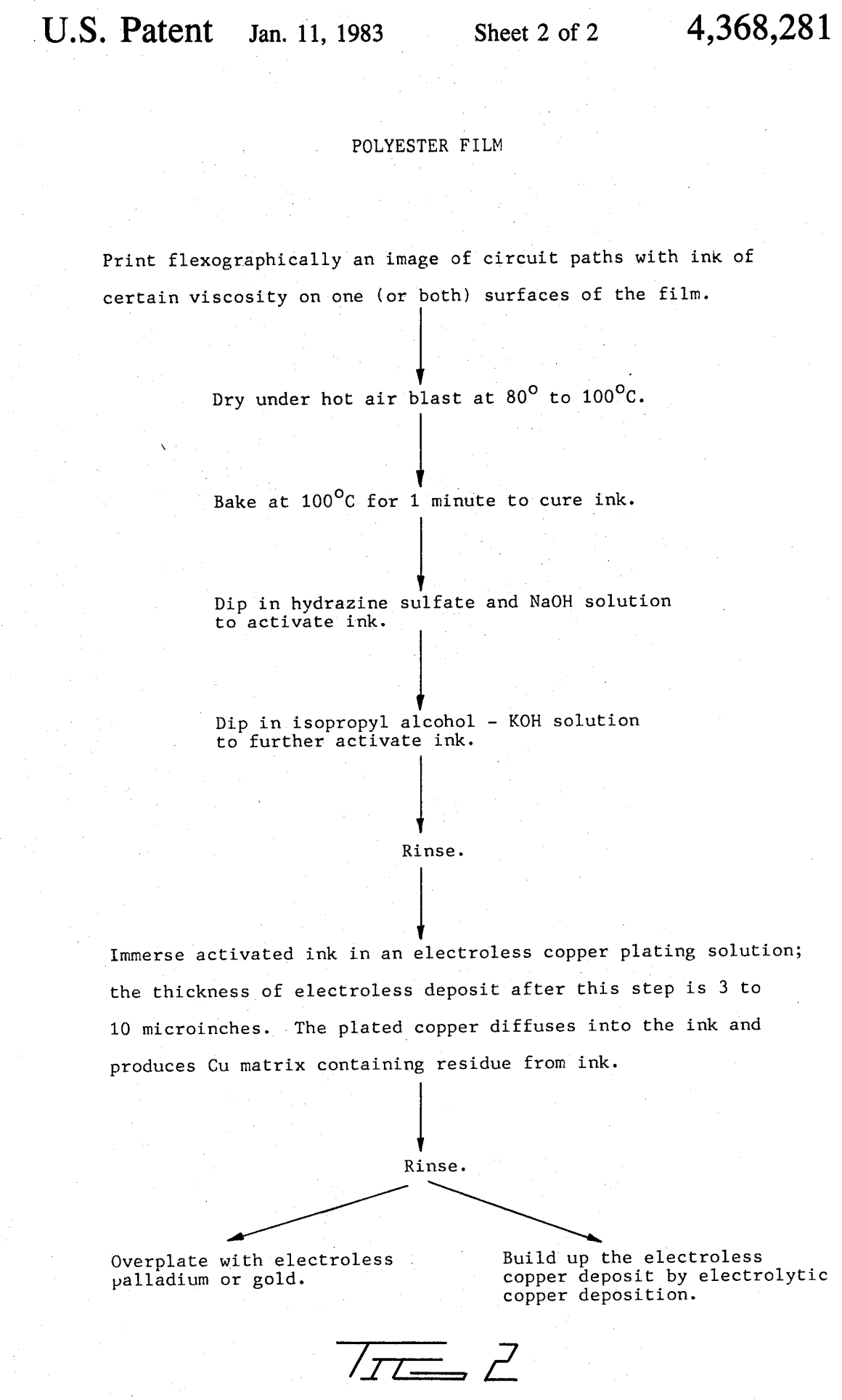

POLYESTER FILM

Print flexographically an image of circuit paths with ink of certain viscosity on one (or both) surfaces of the film.

↓

Dry under hot air blast at $80^{\circ}$ to $100^{\circ}C$.

↓

Bake at $100^{\circ}C$ for 1 minute to cure ink.

↓

Dip in hydrazine sulfate and NaOH solution to activate ink.

↓

Dip in isopropyl alcohol - KOH solution to further activate ink.

↓

Rinse.

↓

Immerse activated ink in an electroless copper plating solution; the thickness of electroless deposit after this step is 3 to 10 microinches. The plated copper diffuses into the ink and produces Cu matrix containing residue from ink.

↓

Rinse.

↙ ↘

Overplate with electroless palladium or gold.

Build up the electroless copper deposit by electrolytic copper deposition.

FIG. 2

PRINTED CIRCUITS

FIELD OF THE INVENTION

This invention relates to printed circuits; more particularly, this invention relates to novel inks suitable for producing by printing and other steps electrically conductive circuit configurations on substrates, such as flexible substrates. This invention further relates to novel ink base compositions developable into metallized, printed circuits. Within the scope of this invention are novel printed circuit precursor compositions based on an ink deposit which is thereafter, step-wise, developed into compositions onto which electrolessly and/or electrolytically, various metals may be deposited.

BACKGROUND FOR THIS INVENTION

Typically, printed circuits are made by an additive, a semi-additive, or a subtractive process. In an additive process, a conductive pattern is deposited on a nonconductive substrate and thereafter the conductive pattern is built up such as by electroless and/or electrolytic deposition of the conductive metal. Many problems are especially associated with adhesion of the circuit pattern to the substrate. Coating the substrate surface with an adhesive primer helps to alleviate the problem. However, that causes shortcomings, for example, the primer remains on the surface after processing causing tackiness which is especially unwanted when packaging the material. In addition, the optical appearance of the film is also undesirable and may affect resist processing. Improper adhesion is also a cause for poor conductivity in a circuit path causing inadequate deposition of an electrolytically deposited metal.

In a semi-additive process, the circuit is formed by depositing, typically electrolessly, a thin layer of a conductive metal, then covering the future conductive and nonconductive areas with a photographically developable layer which is thereafter removed from the conductive areas of the circuit and the circuit is built-up electrolytically with a metal. Thereafter, the photo-resist (the layer covering the future nonconductive areas) is removed and the electroless metal is removed such as by etching, etc. A semi-additive process suffers from the disadvantages of the extra photo-developing steps, the high cost of photo polymers, the requirement for a thorough removal of the photo-resist so that the electrolytically built up metal does not delaminate as well as removal of the metal.

Additionally, a noble metal etch resist must be added for protection when the blanket conductor is removed. Other shortcomings also have an effect on the deposit. For example, if the thickness and evenness of the resist is not critically correct "pin holing," "mushrooming," and metal background shows up in open spaces. Still other disadvantages are etch residues, plus etchant degradation of the substrate surface affecting optical properties.

In a subtractive process, the future nonconductive area is part of a continuous and conductive layer or sheet on top of a substrate. A photo-resist is developed on the conductive area and the nonconductive area is free from photo-resist. The metal from the future nonconductive area is removed with etchants or by electrolytic back plating (as an anode).

Inasmuch as a considerable amount of a metal must be removed, the subtractive process is slow and the conductive patterns tend to be undercut, i.e., some removal of the metal takes place under the photo-resist. Consequently, adhesion of the circuit to the substrate is impaired, which is especially undesirable in flexible circuits. Moreover, when preparing base material for subtractive process applications either an adhesive is used or hot-roll lamination is practiced for joining the metal layer. In either case, the substrate surface is altered creating additional problems in subsequent photo optical processing.

With this brief background in mind, the following prior art has been considered in evaluating the present invention: U.S. Pat. Nos. 2,703,722; 2,917,439; 2,941,918; 3,006,819; 3,052,957; 3,146,125; 3,267,007; 3,562,038; 3,620,933; 3,625,758; 3,937,857; 3,954,570; 4,006,047; 4,096,043; 4,100,037; 4,144,118, 4,149,768; and 4,159,414.

BRIEF DESCRIPTION OF THE INVENTION

According to the present invention, printed circuits made by the additive process are obtained which possess outstanding properties. Flexible printed circuits on flexible substrates are obtained with outstanding adhesion characteristics. These circuits have high circuit density of excellent resolution and of reliable, repeatable characteristics. Accordingly, when employing a novel ink composition, in combination with steps for curing and developing, a conductive circuit pattern is obtained by an electrolessly deposited metal. Further, the novel printed circuit elements, be these the final circuits or the various developable forms thereof, as articles of manufacture, are within the scope of the invention. The novel ink compositions are believed to be novel compositions of matter.

These circuit patterns by analogy can be considered akin to photographic films when a novel emulsion is discovered. When this emulsion is combined with a film in its undeveloped and developed state, these combinations are also considered novel. In accordance with this invention, the novel ink compositions analogous to the novel emulsions and as such may be used for other purposes than printed circuit production, for example, the novel ink may be used in silk screening and other similar printing processes for obtaining developable conductive paths.

DETAILED DESCRIPTION OF THE INVENTION AND DESCRIPTION OF EMBODIMENTS THEREOF

In accordance with this invention and to aid in understanding the same,

FIG. 2 illustrates schematically a method resulting in the novel printed circuit. A product, a membrane switch, obtained according to the disclosed method is depicted in FIG. 3.

Figure 3:
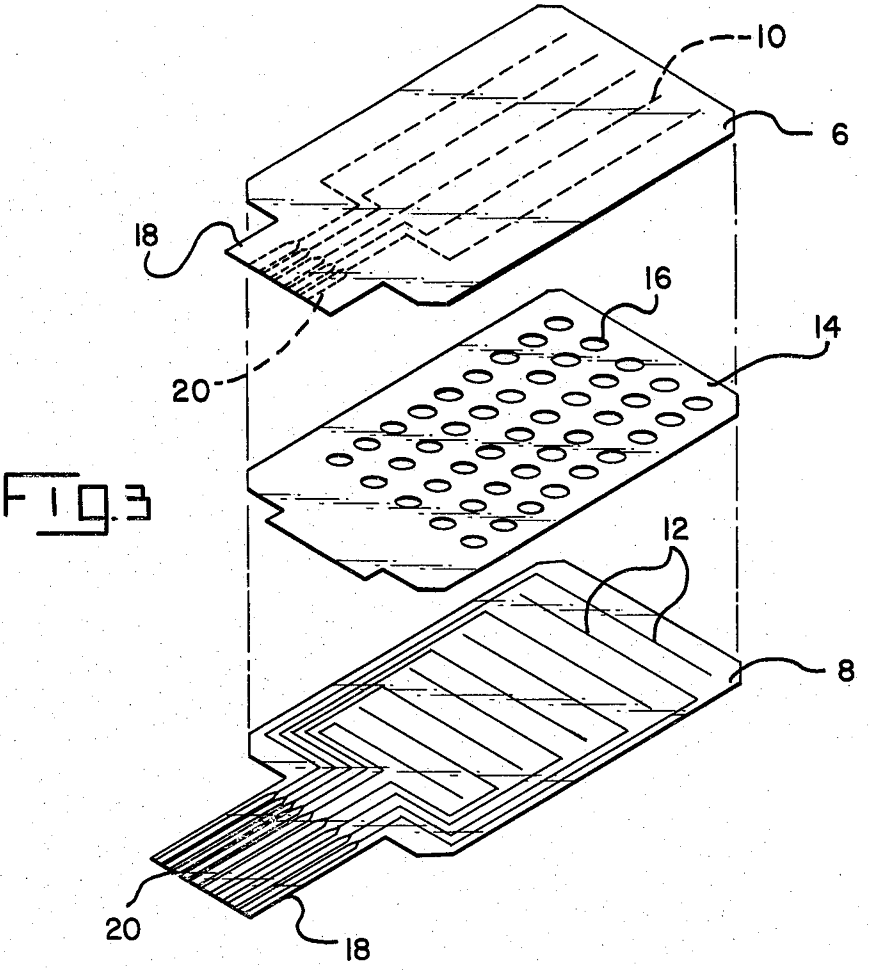

The electrolessly developable forms of the printed circuit may be produced as in the sequence depicted in the FIG. 2 process or may be stored after the ink deposition, drying, and curing. Thereafter, these developable films are activated for electroless development.

Still further, even after activation and treatment, such as with hydrazine sulfate and potassium hydroxide and storage, the printed circuit may be reactivated by a repetition of the above steps. Needless to say, this added feature allows the adoption of the novel method and the products thereof in wide variety of circumstances encountered with rapidly changing product mixture.

When producing novel ink composition, typically the adhesive being employed is a polyester base adhesive. For flexographic printing, these polyesters are usually of a viscosity from 200 cp to 1,200 cp (which signifies molecular weight) and may be further crosslinked by isocyanate or peroxide crosslinking agents to improve adhesion. For flexographic printing, compounded inks have a viscosity from 350 cp to about 1,000 cp.

When crosslinking with isocyanate, crosslinking occurs through the terminal —OH groups of the ink polyester moiety and a small portion through the substrate —OH moiety. Inasmuch as an isocyanate may be a polyfunctional isocyanate with 2 to 4 and even more isocyanate groups, the reaction produces a well crosslinked ink sufficiently adhering to a typical substrate, such as Mylar (a trademark of DuPont Co. describing a polyethylene terephthalate film). Other polyester base films are equally useful as long as the typical, flexible circuit thicknesses are used (generally from 2 to 10 mills, but typically 5 to 7 mills).

For silk screen printing, ink viscosities may be up to 4000 cp. For intaglio printing, the inks may be of a viscosity less than 350 cp and lower, e.g., 100 cp, but require a solvent and a leveling agent to assure print-ink continuity.

Other substrates which may be employed are polyimide, polyimide-amide, polyparabanic acid, polycarbonate, polysulfones, polyamine, cellulose triacetate, etc. These substrates are well known and have been described in the patent and published literature. Moreover, as long as the necessary adhesion can be assured with the novel ink compositions, the choice of substrates is governed by the substrate requirements.

The choice of substrate polymer to a large extent will determine the described choice of adhesive resin base for the ink (although it has been found that the disclosed inks function for a great number of substrates). A resin should be used which is compatible with the substrate, i.e., polyester resin base for polyester film; urethane base for polycarbonate films, etc. The specific adhesive system know to be preferable for bonding to each polymer type is typically used as an ink adhesive.

When compounding the ink, an appropriate coordination complex of palladium is employed. This complex is depicted by a formula LmPdXn, wherein L is a ligand or unsaturated organic group, Pd is a palladium metal base of the complex, X is a halide, alkyl group, or bidentate ligand and m and n are integers wherein m is from 1 to 4 and n is from 0 to 3 with a thermal decomposition temperature for said complex of less than 100° C. for polyester film and in general less than the appropriate distortion temperature for the specific substrate when the thermal decomposition characteristics are used for selecting the palladium complex.

It is noted that the complex must be capable of heat and/or chemical activation. For chemical activation, such as an after treatment of the ink with hydrazine, organic hydrazines, e.g., mono or dimethyl hydrazine, dihydrazine sulfate, etc. in admixture with sodium hydroxide, and/or potassium hydroxide, the ink surface and the exposed interstitial space of the ink provide a chemically active species of the ligand. This species causes a metal to be deposited electrolessly from an appropriate bath in a continuous manner so as to assure a conductive path for subsequent electroless or electrolytic deposition of a metal.

As typical complexes, those mentioned in U.S. Pat. No. 3,937,857 dated Feb. 10, 1976, are useful. In order to assure, however, reasonable activation, the solution chemical reaction may also be varied such as by selection of appropriate time, temperature and concentration of reactants. Moreover, the complexes should be dissolvable in the adhesive composition which is achievable due to the organic moieties of the ligand.

As viscosity of the ink is tailored to meet the printing conditions, a number of fillers or solvents are employed. It has been found that in the ink composition based on the polyester adhesive, certain fillers are suitable. These are zinc oxide, titanium oxide or ferric oxide ($Fe_2O_3$); the last is the preferred filler.

Another filler that has been tried and found less acceptable is antimony trioxide.

For example, ferric oxide is advantageous because it provides a contrast for visual inspection, acts as a synergizer for the Pd-complex metallization catalysis and acts as a diffusion barrier to deposited copper migration. If migration occurs through the ink and reaches the interface, adhesion is reduced. In general, $Fe_2O_3$ as a pigment provides better metallization of the ink, including a thicker metal deposit.

As it has been found that not only the adhesive, but also the filler has to cooperate with the palladium complex, the ink composition becomes fairly sensitive to the compositional variations. Thus, it has been found that a weight ratio of filler to ink should be 8 to 15% by weight based on the total solids content of the ink.

As a component in the ink, a fast evaporating solvent is needed. Typically, such are one or more of a halogenated alkyl compounds of 2 to 4 carbon atoms with the substituents being a chloro, bromo, and/or a fluoro group(s). 1,1,2-Trichloro ethane is a typical example of this solvent. Other useful solvents are those being inert to the ink compounds as well as the palladium complex and having a boiling point of less than 90° C., typically less than 85° C.

On the basis of viscosity, for intaglio printing, the ink composition may be from 80 to 350 cp. At the higher viscosities, the ink may have a tendency to be overly cohesive and cause "stringing" which imposes an upper limit for that printing at that speed because of the "strings" (these are fine, sticky filaments and are unwanted) between the printing means and the printed image. For flexographic printing, the viscosity range for the composition is kept from 350 to 700 cp, but prints with an ink of 300 cp to about 1200 cp have been made. If solvent is added to cut the "stringiness," the ink may "bleed" and, therefore, may not be able to lay down an acceptable printed circuit pattern thickness; therefore, the minimum practical viscosity is that which allows obtention of an image thickness of about 20 $\mu$in. Hence, the proper combination of adhesive composition, the viscosity for same, the filler and solvent need to be considered before a satisfactorily performing nonbleeding, self-smoothing, "nonstringy" ink is obtained.

In a summary, the following show practical ranges for the components in the ink:

Total Solids=12–15% by weight;

Resin Solids=7–18% by weight (only solid portion of adhesive base is considered, remainder of adhesive is solvent.);

Crosslinking agent=0–4% by weight (usually isocyanate; peroxide is alternative);

Pigment=0–16% by weight (when more than 16% pigment it degrades adhesive bonding of image to substrate);

Pd-complex = 5–15% by weight (when less than 5%, no metallization occurs when more than 15% poor adhesion results);

Solvents = 88–47% by weight (when more than 88% image is too thin; when less than 47%, printing is difficult).

In accordance with the invention, the line width, when using the novel inks, may be as little as 10 mils and may also cover the entire sheet. These lines may be designed to have a resistance drop of no more than 5 ohms in a typical continuous reel-to-reel system using roller contacts, or 12 ohms in a batch system using frame contacts when having an electrolessly deposited copper layer. A typical electroless deposit thickness according to this process may be up to 20 μin., but a deposit of 5 to 8 μin. is readily achievable. A line spacing as little as 10 mils is practical and may be achieved repeatedly after electrolessly developing the circuit and thereafter electrolytically depositing a conductive metal thereon such as at a thickness of 50 μin. to 1 mil. When electrolytically building up the circuit, increases in amperage are suggested in the following sequence at 5 minute intervals, 1 amp, 2 amps, and 9 amps until completion.

Inasmuch as the palladium complex is distributed in the ink throughout the same, activation provides adequate sites for the electroless metal to deposit. Some penetration within the ink allows the electroless and/or electrolytic metal to adhere sufficiently tightly, but a shallow diffusion is more desirable as it assures adhesion through a formation of a blend of copper, pigment, and adhesive.

An adhesive and crosslinking agent, when printed as an ink and with an electroless deposit of copper thereon and when tested, such as by the "German wheel" peel test, displayed a peel strength of about 3.5 lb/in. on the average. Hence, the ink compositions as employed have been found to be acceptable.

When printing the image, the ink based circuit pattern may be deposited on one or both sides of the sheet by flexographic printing which is defined as a raised image printing depositing a layer of ink on a substrate by transferring the ink from the flexographic mat to the substrate. Conventionally, the mat is an elastomeric material. The technique for preparing these "printing plates" is well known in the printing art. If the mat has a tendency to swell in the solvent used, and the swelling is tolerable, then accurate dimensions may be achieved by undersizing the initial pattern on the mat.

As soon as the freshly deposited ink leaves the printing mat, it is dried under a hot air blast to remove the solvent. Air is generally at a temperature of about 90° C. to 100° C.; a temperature range from 80° C. to 110° C. may be used.

As the crosslinking reaction is best achieved at an elevated temperature, the dried ink (and the substrate) is baked at a temperature of about 90° to 100° C. for about a minute; the time may be varied, of course, to accomodate any variations associated with the degree of curing. A curing time of two minutes has been found to be adequate.

Although isocyanates have been used as crosslinking agents, other crosslinking agents are also suitable, such as peroxides, e.g., benzoylperoxide, methyl ethyl ketone peroxide, etc. As an illustration of isocyanate crosslinking agents, the following isocyanates are typical: the various isomeric toluene diisocyanates and mixtures thereof; hexamethyl diisocyanate; diphenylmethane diisocyanate; an adduct of trimethylolpropane and toluene diisocyanate, etc.

Inasmuch as in a typical application the substrate is a continuous sheet, from the baking (curing) zone, the substrate with the printing pattern is sent to a tank holding a hydrazine, a hydrazine hydrate or hydrazine sulphate and sodium hydroxide solution. The proportions of hydrazine to sodium hydroxide are within the following range: 90% to 75% by volume of 85% by weight hydrazine hydrate, and 10% to 25% by volume of 25% by weight sodium hydroxide. A solution of 20 grams per liter of hydrazine sulphate to 100 grams per liter of the above sodium hydroxide (added as sodium hydroxide pellets) on a per liter basis works equally well; a ratio of this combination is 15–25 grams hydrazine sulphate to 15–25 grams sodium hydroxide.

Another chemical activator solution for the ink is dihydrazine sulphate. This solution is made up of 20 grams of dihydrazine sulphate plus 100 grams of the above NaOH diluted to 1 liter of water. This solution is advantageous because the dihydrazine sulfate is less volatile than the hydrazine hydrate containing solution.

A temperature of 80° F. is a typically used temperature for the hydrazine sulphate solution; a range from 70° F. to 90° F. may be practical based on a normal ambient variation.

Instead of hydrazine sulphate and sodium hydroxide, other hydrazine type compounds may be used, such as hydrazine itself, dimethyl hydrazine etc.

From the hydrazine sulphate vessel, the substrate, with the partially activated ink, is dipped into an isopropyl alcohol-potassium hydroxide solution for about 1 minute. A typical solution of these two compounds is 10% by weight of KOH (anhydrous basis) to 90% by weight of isopropyl alcohol (technical grade). An appropriate weight percent range of these two components, i.e., KOH and isopropyl alcohol is from 5:95 to 15:85. The above hydrazine treatment step and the potassium hydroxide step may also be interchanged.

After this treatment and the rinsing in pure water, the ink-substrate combination is sufficiently active for electroless plating of an appropriate metal on the activated ink. This electroless plating then develops the printed circuit after a suitable immersion rate of about 1 μin./min. to 3 μin./min. in one of the baths of the following compositions:

| Electroless Coppers: | | |
|---|---|---|
| I. | Copper Sulphate | 10 gm/l |
| | Sodium Hydroxide | 10 gm/l |
| | Formaldehyde (37%-41% W/V) | 10 gm/l |
| | Sodium Potassium Tartrate | 50 gm/l |
| II. | Cupric Oxide | 3.0 gm/l |
| | Sodium Hypophosphite | 10 gm/l |
| | Ammonium Chloride | 0.1 gm/l |

As a practical matter, a thickness of 3 to 10 microinches are generally developed in these baths.

Other metals which may be deposited electrolessly are gold, silver, and palladium. Bath compositions for these metals are disclosed in the prior art, such as U.S. Pat. No. 3,937,857.

After the obtention of the electrolessly developed print, the copper deposit may be further plated with an electroless deposit of palladium or gold, or electrolytically built up with copper. For the above electrolytic deposits, the following baths, as an illustration, were used:

Electrolytic Cu

Copper Sulfate—28.0 oz./gal.
Sulfuric Acid—7.0 oz./gal.
Bath Temp.—20°-30° C.
Current Density—10-30 A.S.F.

Electrolytic Palladium

Palladium diamino dinitrate—1 oz./gal.
Pyrophosphate ($P_2O_7$)—20 oz./gal.
Bath Temp.—150° F.
Current Density—5-10 A.S.F.

Electrolytic Gold

Potassium Gold Cyanide—1 oz./gal.
Potassium Cyanide—30 oz./gal.
Bath Temp.—120°-150° F.
Current Density—1-5 A.S.F.

As a noteworthy benefit, the deposited and cured ink-catalyst composition is more thermally stable than the cured ink composition by itself. The stability improvement is unexpected.

A further benefit in the electroless deposition is the presence of pigment. Thus, when an ink and Pd-complex composition was used without a pigment, its deposition ratio was good, but an ink with a pigment provided a significantly thicker deposit for better conductivity and contact during subsequent, electrolytic buildup. (For ease of description, the herein disclosed complexes are referred as Pd-complex, but all disclosed metal complexes are intended. Of the pigments mentioned, ferric oxide ($Fe_2O_3$) is preferred. Pigment performance (and thus the ink) may be further improved by use of titanate coupling agents. These are disclosed e.g., in *Modern Paint and Coatings,* April 1950, pp. 44 to 49. Incorporation of these titanates in the printing ink improves the ultimate electroless deposit although the reasons therefore are unknown.

Of further significance is the addition sequence of the Pd-complex to the adhesive when formulating the ink. This sequence appears to be associated with the unique nature of the ink and Pd-complex composition. For example, when the Pd-complex is added in admixture with the isocyanate, it appears to be complexed with the isocyanate as characterized by the color of the complex (such as the bisbenzonitrile palladium dichloride and the isocyanate) upon addition to the adhesive. In this instance, the color is a light tan and the electrolessly deposited end product is better. When the same complex is added without the isocyanate curing agent, a greenishbrown tint appears in the same adhesive. If the Pd-complex is added last, gel formation occurs, especially when ink has been cooled.

When depositing the ink, the feature thickness of the cured ink was about 15 to 75 microinches with the average thickness being from 20 to 35 $\mu$in., the deposit thickness depends on the adhesive being used, all other conditions being equal.

As a rule, image thickness will increase with increased printing speed. A low speed will cause bleeding. A typical printing speed is about 100 ft/min. This speed will depend also on the drying time. When printing, it is essential that a continuous buss-bar system is maintained for the printed circuit pattern for proper subsequent electrodeposition.

It has also been found that when drying the ink, the ambient humidity conditions should be such that no more than 60% but better 40%, preferably 30%, of relative humidity is maintained.

If higher humidity is experienced, then the electroless deposit tends to blister and is a cause for less than 100% deposition of metal on the printed ink in an electroless bath. If the ink and Pd-complex composition is dried afterwards, then the effect caused by high humidity, i.e., incomplete metal coverage can be reduced; this effect could also be reduced by prolonged (double) exposure of the ink-substrate in the above-described hydrazine sulphate solution. Use of solvents, such as toluene, which exhaust the catalyst from the image surface should also be avoided.

When formulating the pigment and adhesive composition, it is highly recommended that a thorough distribution of the pigment is achieved such as by ball milling for a prolonged time (16 hours or more). High speed blenders are also acceptable to reduce the time and impart the necessary shear action to the blend.

Both the Pd-complex and the adhesive are adversly affected by water, therefore, equipment should be dry. All cleaning may be done with acetone and/or 1,1,2 trichloroethane.

The following is an illustration of an embodiment of this invention.

A. Synthesizing of the Complex

To synthesize the complex, 4 gm of $PdCl_2$ are weighed and then crushed to a fine powder such as by grinding. After grinding of the $PdCl_2$, to it is added up to 225 ml of 99% benzonitrile in a 400 ml flask. Although this flask is covered it must be vented to prevent pressure build up. This mixture is then heated to 175° to 180° C. and stirred until the $PdCl_2$ is dissolved (in about 2 hours). Through a Buchner funnel this solution is filtered into a vacuum flask containing 2 liters of petroleum ether. When $PdCl_2$ dissolves, the complex is already formed; but is dissolved in the excess benzontrile, the filtration is to remove any unreacted $PdCl_2$. The petroleum ether extracts the excess benzonitrile, allowing the yellow bis-benzonitrile palladium dichloride crystals to precipitate. Thereupon, yellow precipitate will form. In a Buchner funnel, the precipitate is then filtered such as by the aid of vacuum. The filtered residue is the Pd-complex.

The above procedure should typically yield at least 8 gm of complex i.e., the metallization catalyst precursor. The complex is a very stable complex and can be stored indefinitely if protected from moisture.

B. Formulation Procedure for ink

1. Into a container, 1005 gm of pigmented adhesive resin of polyethylene terephthalate are weighed containing 38.76 gm of the $TiO_2$ per kilogram of polyester adhesive.

63 gm of the Pd-complex are dissolved in 504 ml of 1,1,2 trichloroethane. To this amount is added 11.25 grams of toluene disocyanate (TDI). The admixed complex-isocyanate composition is then added to a closed container for 30 minutes. The adhesive can now be used for printing or can be stored, packed in dry ice. If isocyanate is present, storage life of a prepared adhesive appears to be about 4 weeks in dry ice or about 24 hours at room temperature. Storage life appears to be indefinite if no isocyanate is present. Equipment used can be cleaned with 1,1,2 trichloroethane followed by acetone and air dried.

When preparing the polyester adhesive-$TiO_2$ mix, the $TiO_2$ is added to the adhesive at the rate of 38.7 gm/kilogram of polyester. The mixture is then ball milled for about 16 hours.

2. In a similar manner as above the following ink formulation was prepared, (the percent being in percent by weight)

| | | | | | | | |
|---|---|---|---|---|---|---|---|
| Polyester adhesive | 1,032 | gm | or | 770 | ml | Total Solids = 278.4 gm percent solids = 20% |
| Bis-benzonitrile paladium dichloride | 32 | gm | or | 7.6 | ml | Percent complex in total solids = 11.5% |
| $Fe_2O_3$ (powder) | 40 | gm | or | 200 | ml | Percent pigment in total solids = 14.4% |
| 1,1,2 trichloroethane solvent | 288 | gm | or | 200 | ml | |
| Isocyanate (none) | — | | | — | | |
| | 1,392 | gm | | 977.6 | ml | Ink Density = 1.424 gm/cc and viscosity = 925 cp |

C. Preparation of a developable film image

A total of about 1,805 grams of a 13.5% by weight solids content adhesive described in B.1 above, was used as an ink base. It consisted of about 967 grams (726.5 ml-density 1.33 gr/ml) of the above identified 14.2% solid content polyester adhesive, about 37.5 grams of titanium dioxide powder, about 725.6 grams of 1,1,2-trichloroethane (504.0 ml density 1.44 gr/ml) and about 63 grams of bis-benzonitrile palladium dichloride. In addition, as an adhesive promoter, Pliobond 4295 was used in amount of about 11.25 gr. (11 ml. density, 1.024 gm/ml) of a solids content of about 71.2% by weight.

A viscosity of 100 cp was measured for this ink. A conventional commercial type of flexographic printer was then used with an elastomeric mat. Typically, a flexographic mat is a rubber base curable composition cast on a metal mold (the female pattern is the metal mold).

Employing a mat produced as above, the described adhesive was then printed on a Mylar polyester sheet of 5 to 7 mils thickness. A dry ink deposit of an average thickness of about 25 μin. and a feature range from 10 to 55 μin. was obtained. Various viscosities were then tried including viscosities up to about 1200 cp. At the higher viscosities, the surface was rough, but adequate electroless deposition could be obtained. However, viscosities in the range from 350 to 700 cp appear preferable.

In general, average thickness from 10 to 35 μin. were obtained with a feature range from 10 to 75 μin. An average thickness of 20 to 35 μin. is readily achievable. A printing speed of 100 ft/min. was used, but speeds from 25 ft/min. to 260 ft/min. may be used depending on the above discussed thickness and viscosity requirements and the "stringiness" imposed limit.

D. Electroless development of the printed image

When the substrate with the dried ink is cured as depicted in the flow sheet in FIG. 2 and as described above, a circuit is obtained as depicted in FIG. 1. It is of an electrolessly developed copper image. This image is further built up such as when overplated with electrolessly deposited palladium or gold or when built up electrolytically with a copper plate.

The above first described copper baths were used in the deposition of both electroless and electrolytic copper.

In a similar manner, applying the above invention, membrane switches were produced as depicted in FIG. 3. Other circuit patterns suitable for other purposes have also been produced.

In addition to the polymer base substrates recited above, other polymer bases are suitable, e.g., polyurethanes, polyepoxides, etc. Various modification in the resin adhesive are also made to improve adhesion between the palladium complex containing ink adhesive and the substrate. Besides the above substrates, other substrates lend themselves to the application of the novel ink composition, such as nonwoven base materials, e.g., Ramie (a polyester nonwoven material available from duPont Co.) and various paper, i.e., cellulosic base materials.

Although flexographic printing was depicted as the embodiment of this invention, gravure, intaglio, letter press and silk screen printing is equally applicable as there is a sufficient flow of the ink to form a continuous layer, provided the viscosity is appropriately adjusted. Overprinting also provides an easier buildup of the ink if it is necessary. As it is well appreciated, intaglio printing is faster and therefore requires a less "stringy" ink; therefore, the viscosity of the ink is adjusted to make it less "stringy" so as to suit the printing speed, the rate of drying and the amount of ink sought to be deposited.

Even though only the palladium complexes have been depicted in the various embodiments herein as the activatable species for obtaining the electroless deposits of the various metals, other complexes are believed to be useful. These are depicted by the general formula LmZXn, wherein Z is (besides the above depicted palladium as the preferred species), platinum, nickel, silver or copper, and the other moieties are as previously defined. These complexes are believed to be also useful in the formulation of the ink compositions and the developable electroless circuits.

Figure 1:
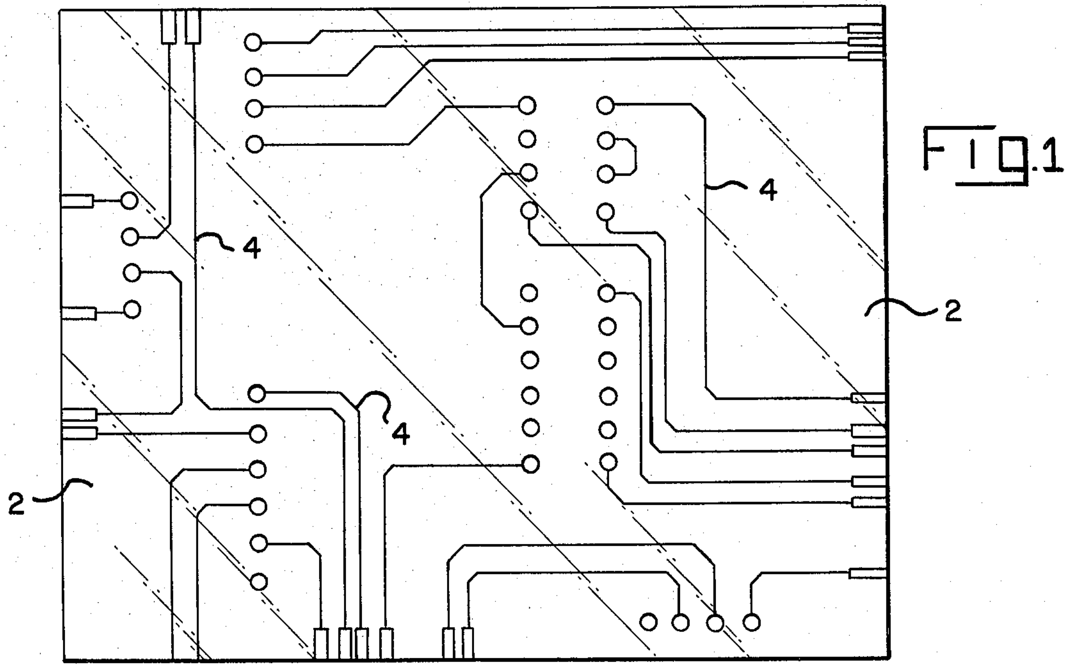
FIG. 1 shows a typical form of a printed circuit.

FIGS. 1 and 3 show typical products which can be produced by the practice of the invention. FIG. 1 shows a typical printed circuit comprising a substrate 2 having metallized conductors 4 on one of its surfaces which extend irregularly in accordance with the requirements of the circuits. These conductors can be quite narrow, as explained above, where required so that high density of conductors can be achieved.

FIG. 3 shows the components of a typical membrane type switch comprising spaced-apart substrates 6, 8 having switch conductors as shown at 10 and 12 on their opposed surfaces. The conductors 6, 12 extend normally of each other and a separator member 14 is provided with openings 16 at the crossing points of the conductors. The switch defined by a particular crossing point can thus be closed by simply pressing on the upper substrate 6. The substrates have tail portions 18 to which the ends of the conductors extend as shown at 20. Further conductors can be connected to these tail portions by a suitable connector or other means.

What is claimed is:

1. An ink for printing of electronic circuits on a substrate comprising: a substrate compatible polymer base resin adhesive of a polyester, a polyimide, polyimide-amide, poly-parabanic acid, polycarbonate, polysulfones, polyamine, cellulose triacetate, polyepoxides, or polyurethane, a filler from 0 to about 16%, by weight, based on total solids content of the ink, and from about 5 to about 16%, by weight, based on total solids content of ink, a coordination complex of a metal of a formula LmZXn, wherein L is a ligand or unsaturated organic group, Z is palladium, platinum, nickel or copper metal base of the complex, X is halide, alkyl group, or bidentate ligand and m and n are integers wherein m is from 1 to 4 and n is from 0 to 3, a halogenated alkyl compound of 2 to 4 carbon atoms as a solvent for said ink, said ink having a viscosity of 80 to 2000 cps.

2. An ink for printing of electronic circuits on a substrate comprising: a polyester base resin adhesive, a filler from 0 to about 15%, by weight, based on total solids content of ink, and from about 5 to about 15%, by weight, based on total solids content of ink, of a coordination complex of palladium of a formula LmZXn wherein L is a ligand or unsaturated organic group, Z is palladium, platinum, nickel or copper metal base of the complex, X is a halide, alkyl group, or bidentate ligand and m and n are integers wherein m is from 1 to 4 and n is from 0 to 3, a halogenated alkyl compound, such as of 2 to 4 carbon compounds, as a solvent for the said ink, said ink having a viscosity of 80 to 2000 cps.

3. The ink as defined in claim 2, wherein the substrate polymer is a polyester base.

4. The ink as defined in claim 2, wherein the polymer base resin adhesive contains a crosslinking agent therefor.

5. The ink as defined in claim 4, wherein the crosslinking agent is an isocyanate crosslinking agent.

6. The ink as defined in claim 2, wherein the coordination complex of palladium is bisbenzonitrile palladium dichloride.

7. The ink as defined in claim 2, wherein the ink contains a pigment as a filler and wherein the pigment is titanium dioxide.

8. The ink as defined in claim 2, wherein the filler is ferric oxide.

9. The ink as defined in claim 2, wherein the solvent is 1,1,2-trichloroethane.

10. The ink as defined in claim 2, wherein the same contains from 0 to 2% by weight of an organo functional titanate coupling agent as an additive for said filler.

11. The ink composition as defined in claim 2, wherein the same comprises: total solids from 12 to 55% by weight, resin solids from 5 to 20% by weight, crosslinking agent from 0 to 4% by weight, pigment from 0 to 16% by weight, coordination complex from 5 to 15% by weight, and solvent or solvent mixtures from 88 to 45% by weight.

12. The ink as defined in claim 11, wherein the same has a total solids content from 15 to 20% by weight.

* * * * *